US009003245B2

(12) United States Patent
Hamanaka

(10) Patent No.: US 9,003,245 B2
(45) Date of Patent: Apr. 7, 2015

(54) ERROR CORRECTION DEVICE

(71) Applicant: Denso Corporation, Kariya, Aichi-pref (JP)

(72) Inventor: Yoshiyuki Hamanaka, Kariya (JP)

(73) Assignee: Denso Corporation, Kariya (JP)

( * ) Notice: Subject to any disclaimer, the term of this patent is extended or adjusted under 35 U.S.C. 154(b) by 165 days.

(21) Appl. No.: 13/893,923

(22) Filed: May 14, 2013

(65) Prior Publication Data

US 2014/0019816 A1 Jan. 16, 2014

(30) Foreign Application Priority Data

Jul. 13, 2012 (JP) ................................ 2012-157718

(51) Int. Cl.

*H03M 13/00* (2006.01)
*G06F 11/00* (2006.01)
*H04L 1/20* (2006.01)
*H03M 1/50* (2006.01)
*G06F 11/24* (2006.01)

(52) U.S. Cl.

CPC ............... *H04L 1/206* (2013.01); *H03M 1/504* (2013.01); *G06F 11/24* (2013.01)

(58) Field of Classification Search

CPC ..................... H03M 1/504; H03M 2201/4165; H03M 2201/4175; G06F 11/24; H04L 1/206
USPC ........................... 714/709, 746, 812; 332/109
See application file for complete search history.

(56) References Cited

U.S. PATENT DOCUMENTS 5,019,773 A * 5/1991 Sugiura et al. ................ 324/166
2010/0115336 A1* 5/2010 Shin et al. ....................... 714/27
2013/0120075 A1* 5/2013 Katou ........................... 332/109

FOREIGN PATENT DOCUMENTS

JP 2008-249374 10/2008
JP 2009-171312 7/2009
JP 2011-007580 1/2011
JP 2011-027456 2/2011

* cited by examiner

*Primary Examiner* — Shelly A Chase
(74) *Attorney, Agent, or Firm* — Nixon & Vanderhye PC

(57) ABSTRACT

In an error correction device, a frame generation section receives pulse signals as temperature information of a power switching element transmitted from a PWM comparator. The frame generation section sets a first correction pulse signal, a second correction pulse signal and the temperature information sequentially into each frame. A pulse width of the first correction pulse signal corresponds to a pulse width when a time ratio thereof becomes 100%. A pulse width of the second correction pulse signal corresponds to a pulse width when a time ratio thereof becomes 50%. A microcomputer receives the temperature information through a photocoupler and corrects the received temperature information. The microcomputer calculates a temperature detection value of the power switching element on the basis of the corrected temperature information.

15 Claims, 7 Drawing Sheets

OUTPUT SIGNAL Vf OF TEMPERATURE SENSING DIODE SD, TRIANGLE WAVE SIGNAL tc

OUTPUT SIGNAL OF PWM COMPARATOR 16

TIME RATIO Duty (%) = $\dfrac{Ton}{Tperiod}$

OUTPUT SIGNAL Vf(V) OF TEMPERATURE SENSING DIODE SD

TEMPERATURE Tj(°C) OF POWER SWITCHING ELEMENT SW

TIME RATIO Duty (%) AS OUTPUT OF PWM COMPARATOR 16

OUTPUT SIGNAL Vf(V) OF TEMPERATURE SENSING DIODE SD

ERROR CORRECTION DEVICE

CROSS-REFERENCE TO RELATED APPLICATION

This application is related to and claims priority from Japanese Patent Application No. 2012-157718 filed on Jul. 13, 2012, the contents of which are hereby incorporated by reference.

BACKGROUND OF THE INVENTION

1. Field of the Invention

The present invention relates to error correction devices to be used in physical property value detection devices comprised of a detection element, a modulation section and a detection section. The detection element detects a value of a physical property of a detection target, and outputs detection signals relating to the detected value of a physical property of the detection target. The modulation section modulates the detection signals outputted from the detection element into pulse signals, and outputs the pulse signals. The detection section receives the pulse signals transmitted from the modulation section through a pulse signal transmission path, and detects the value of the physical property of the detection target on the basis of the received pulse signals.

2. Description of the Related Art

There have been proposed and used various types of error correction devices. For example, Japanese patent laid open publication No. JP 2009-171312 has disclosed an error correction device having a conventional structure comprised of a temperature sensing diode, a modulation circuit and a microcomputer as a detection section. The temperature sensing diode detects a temperature of a detection target (a semiconductor switching element, for example a power switching element, etc.) and generates and outputs detection signals relating to a detected temperature of the detection target. The modulation section receives the detection signals transmitted from the temperature sensing diode, and modulates the received detection signals to pulse signals. The microcomputer as the detection section receives the pulse signals transmitted from the modulation circuit through a photo-coupler mounted on a pulse signal transmission path, and detects a temperature of the detection target on the basis of the received pulse signals.

In general, when noise is added to the pulse signals on the pulse signal transmission path to which the photocoupler is mounted, such noise added into the pulse signals often cause the microcomputer to decrease a detection accuracy of the temperature of the detection target.

Various types of physical property value detection devices have the above problem of decreasing or deterioration of the detection accuracy caused by noise so long as these detection devices detect a value of a physical property of a detection target on the basis of detection signals transmitted through a transmission path which has a photocoupler, where the detection signals relate to a value of a physical property of the detection target detected by a detection element such as a temperature sensing element.

SUMMARY

It is therefore desired to provide an error correction device having a structure and function capable of detecting a value of a physical property of a detection target with high accuracy, and preventing the detection accuracy of the value of the physical property of the detection target from being decreased and deteriorated.

An exemplary embodiment provides an error correction device to be used in a physical property value detection device. The error correction device has a modulation section, a setting section, a transmission path, an error calculation section, a correction section and a detection section. The modulation section receives output signals transmitted from a detection element. The detection element detects a value of a physical property of a detection target, generates and outputs the output signals which correlate with the detected value of the physical property of the detection target. The modulation section modulates the received output signals to pulse signals, and outputs the modulated pulse signals. The setting section sets a plurality of correction pulse signals having a different pulse width into a series of the modulated pulse signals outputted from the modulation section. The modulated pulse signals and the correction pulse signals are transmitted from the setting section through the transmission path. The error calculation section calculates an error contained in the modulated pulse signals transmitted through the transmission path on the basis of a pair of correction pulse signals in the modulated pulse signals transmitted through the transmission path. A pulse width of the modulated pulse signal is changed by the error. The correction section corrects the modulated pulse signals to be used for detecting the value of a physical property of the detection element on the basis of the error calculated by the error calculation section. The detection section detects the value of the physical property of the detection element on the basis of the modulated pulse signals corrected by the correction section.

A plurality of the correction pulse signals is inserted into a series of modulated pulse signals transmitted from the modulation section. In general, noise is added to the correction pulse signals in addition to the modulated pulse signals on the transmission path. Such noise often causes detection error. In particular, regardless of a pulse width of a pulse signal, the pulse width of the pulse signal is changed to a constant value by the error caused by noise occurring on the transmission path including a photocoupler as an opto-isolator. It is accordingly possible to calculate a magnitude of the error, caused by noise added into the transmission path including the photocoupler, by using a pair of correction pulse signals in a plurality of the correction pulse signals having a different pulse width. The error calculation section and the correction section correct the modulated pulse signals, transmitted from the modulation section through the transmission path in order to eliminate the error from the modulated pulse signals. The error correction device is capable of preventing a detection accuracy of a value of a physical property of a detection target such as a temperature of a power switching element from being decreased by noise.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Figure 1:
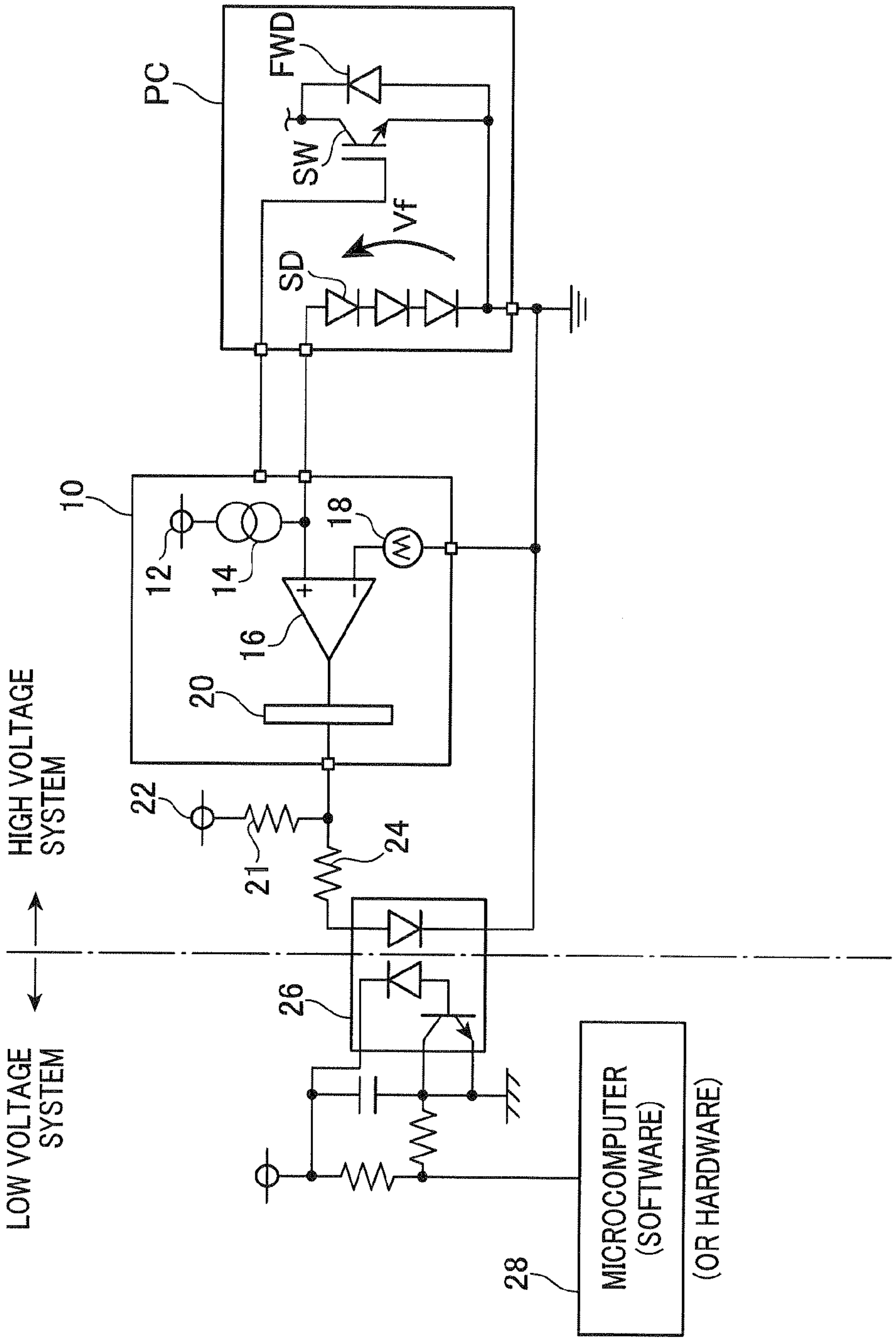
FIG. 1 is a view showing a structure of a system equipped with an error correction device according to a first exemplary embodiment of the present invention.

Hereinafter, various embodiments of the present invention will be described with reference to the accompanying drawings. In the following description of the various embodiments, like reference characters or numerals designate like or equivalent component parts throughout the several diagrams.

First Exemplary Embodiment

A description will be given of an error correction device according to a first exemplary embodiment which is used in a vehicle equipped with an electric rotary machine as a main drive machine with reference to FIG. 1 to FIG. 9.

FIG. 1 is a view showing a structure of a system equipped with the error correction device according to the first exemplary embodiment.

The system equipped with the error correction device shown in FIG. 1 is comprised of a high voltage system (as a first section) and a low voltage system (as a second section) mounted to a vehicle. The low voltage system has a reference voltage of the body of a vehicle. The high voltage system is electrically insulated from the low voltage system. A power card PC is a power module mounted to the high voltage system in the system of the vehicle. The power card PC is comprised of a power switching element SW, a freewheel diode FWD, a temperature sensing diode SD which are packaged together. The temperature sensing diode SD forms an inverter connected to an electric rotary machine which acts as a main drive machine of the vehicle. The temperature sensing diode SD is arranged at the power switching element SW to detect a temperature of the power switching element SW.

The system equipped with the error correction device according to the present invention uses an insulated gate bipolar transistor (IGBT) as the power switching element SW. The high voltage system corresponds to the first section, and the low voltage system corresponds to the second section.

An open/close control terminal (a gate terminal) of the power switching element SW is connected to an integrated circuit 10. The integrated circuit 10 is a specified semiconductor device forming a driving circuit of the power switching element SW.

The integrated circuit 10 has a function for converting an output signal Vf transmitted from the temperature sensing diode SD to a binary signal. In more detail, the integrated circuit 10 is comprised of an electric power source 12, a constant current source 14, a PWM comparator 16, etc.

The output terminal of the constant current source 14 is connected to an anode terminal of the temperature sensing diode SD, and a cathode terminal of the temperature sensing diode SD is connected to the ground.

The anode terminal of the temperature sensing diode SD is connected to a non-inverting input terminal of a pulse width modulation comparator (PWM comparator) 16. An inverting-input terminal of the PWM comparator 16 is connected to a carrier generation circuit 18. The carrier generation circuit 18 generates and outputs a carrier signal (a triangle wave signal).

Figure 2A:
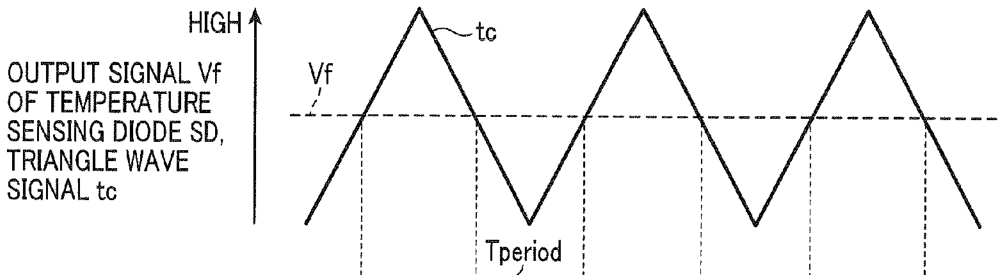
FIG. 2A and FIG. 2B are views explaining an example of a pulse width modulation (PWM) processed by the error correction device according to the first exemplary embodiment shown in FIG. 1.
Figure 2B:
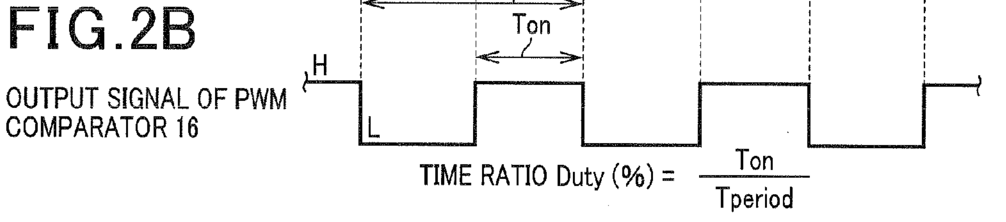

FIG. 2A and FIG. 2B are views which explain an example of a pulse width modulation (PWM) processed by the error correction device according to the first exemplary embodiment shown in FIG. 1.

As shown in FIG. 2A and FIG. 2B, the PWM comparator 16 compares an output signal Vf of the temperature sensing diode SD with the triangle wave signal tc, and modulates the output signal Vf of the temperature sensing diode SD on the basis of the comparison result.

FIG. 2A shows a transition of the output signal Vf of the temperature sensing diode SD and the triangle signal tc. FIG. 2B shows a transition of the output signal of the PMW comparator 16. The PWM comparator 16 outputs an output signal, a time duty Duty of which varies due to the output signal Vf of the temperature sensing diode SD, where the time duty Duty is a ratio of a period Ton of a logical high (H) level to a reference time length Tperiod. The reference time length Tperiod indicates one period of a logical high (H) level and a logical low (L) level L. The PWM comparator 16 and the carrier generation circuit 18 form a modulation section.

Figure 3A:
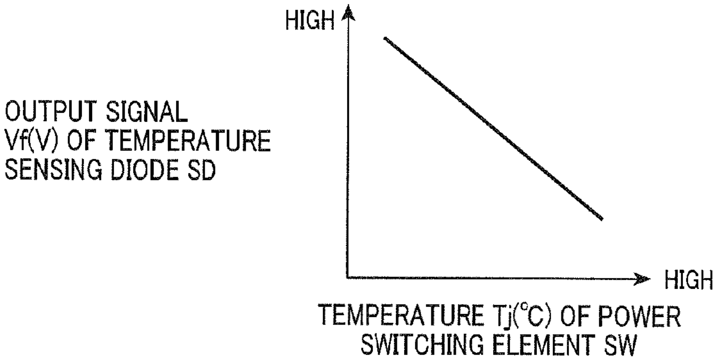
FIG. 3A and FIG. 3B are views explaining output characteristics of a temperature sensing diode, for example which is mounted on a power card PC in the error correction device according to the first exemplary embodiment.
Figure 3B:
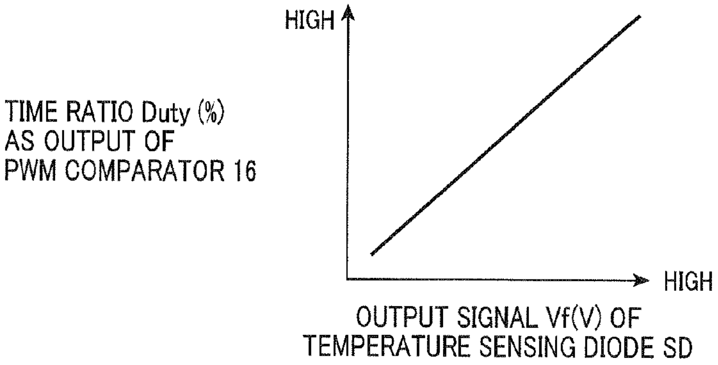

FIG. 3A and FIG. 3B are views explaining output characteristics of the temperature sensing diode SD mounted on the power card PC in the error correction device according to the first exemplary embodiment.

As shown in FIG. 3A, there is a negative correlation between the output signal Vf of the temperature sensing diode SD and an actual temperature Tj of the power switching element SW. As shown in FIG. 3B, the time duty Duty (%) of the output signal of the PWM comparator 16 is increased according to increasing the output signal Vf of the output signal Vf of the temperature sensing diode SD. That is, the time ratio Duty (%) of the output signal of the PWM comparator 16 is decreased due to increasing an actual temperature Tj of the power switching element SW.

As shown in FIG. 1, the PWM comparator 16 transmits the output signal to a frame generation section 20 (or a setting section) in the high voltage system. The frame generation section 20 generates and outputs a frame comprised of data items containing a plurality of pulse signals (as modulated pulse signals) transmitted from the PWM comparator 16. The pulse signals transmitted from the PWM comparator 16 indicate information regarding a temperature of the power switching element SW detected by the temperature sensing diode SD. A method of arranging the data items regarding the detected temperature in the frame will be explained later in detail.

The output terminal of the frame generation section 20 is connected to a power source 22 through a resistance 21. Further, the output terminal of the frame generation section 20 is connected to a primary side of a photocoupler (a photo diode) through a resistance 24. The photocoupler is an opto-isolator as an insulation transmission section which electrically insulates the high voltage system from the low voltage system. The phtocoupler transmits a signal from the high voltage system to the low voltage system.

The secondary side of the photocoupler 26 is connected to a microcomputer 28. The microcomputer 28 executes software comprised of one or more programs in order to convert the information data transmitted from the frame generation section 20 through the photocoupler 26 into digital data items. The microcomputer 28 executes a temperature detection process, namely, calculates a temperature detection value Td (° C.) as a temperature of the power switching element SW on the basis of the digital data items which have been converted.

Figure 4:
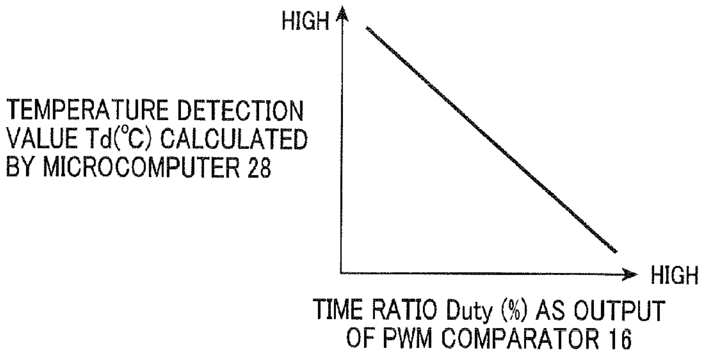
FIG. 4 is a view showing a relationship between a time ratio Duty (%) and a temperature detection value Td (° C.) calculated by a microcomputer in the error correction device according to the first exemplary embodiment.

FIG. 4 is a view showing a relationship between a time ratio Duty (%) and a temperature detection value Td (° C.) calculated by the microcomputer 28 in the error correction device according to the first exemplary embodiment.

As shown in FIG. 4, the microcomputer 28 calculates a temperature detection value Td of the power switching element SW which is increased according to decreasing the time ratio Duty of the pulse signal (as the output signal) of the power switching element SW contained in the frame. The above process of detecting or calculating the temperature of the power switching element SW is processed by using a map. The map indicates a relationship between the time ratio Duty (%) and the temperature detection value Td (° C.) in a one-to-one correspondence.

When judging that the temperature detection value Td of the power switching element SW is not less than a threshold temperature value, the microcomputer 28 executes a power save process for prohibiting driving the power switching element SW. The power save process prohibits a collector current of the power switching element SW in order to avoid the power switching element SW from being overheated.

Figure 5A:
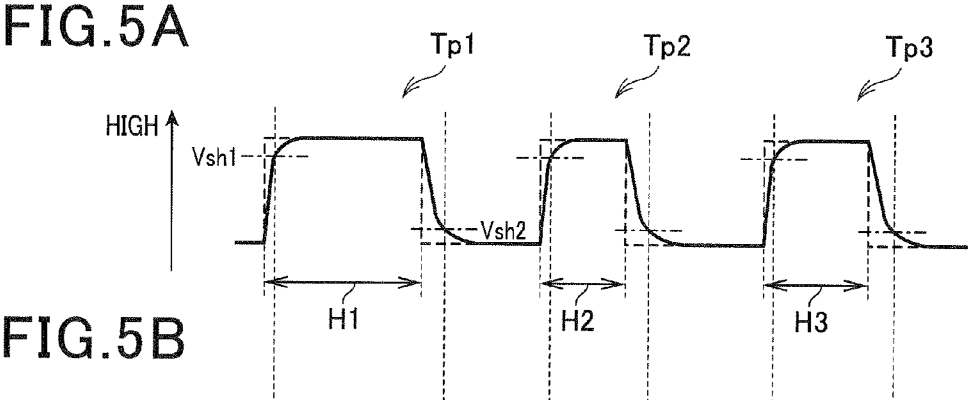
FIG. 5A and FIG. 5B are views showing cases in which errors are added into pulse signals on a pulse signal transmission path used in the error correction device according to the first exemplary embodiment.
Figure 5B:
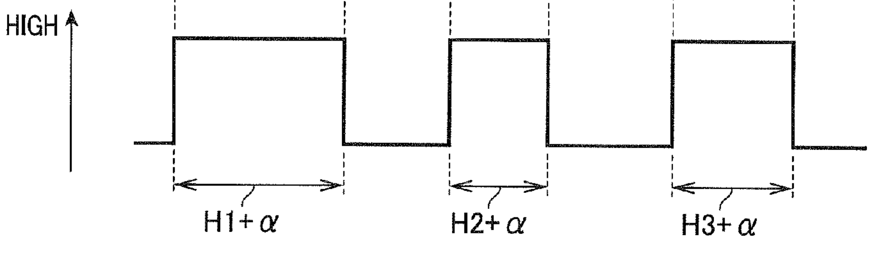

FIG. 5A and FIG. 5B are views showing cases in which errors are added into pulse signals on a pulse signal transmission path used in the error correction device according to the first exemplary embodiment.

As shown with dotted lines in FIG. 5A, an ideal waveform of the pulse signal as temperature information of the power switching element SW to be transmitted to the microcomputer 28 through a transmission path including a photocoupler has a square shape. However, as shown with solid lines shown in FIG. 5B, an actual pulse signal of the power switching element SW has a waveform which becomes steady after the elapse of a constant delay time counted from a rising time or a falling time of the pulse signal. This means that a signal transmission delay is caused in the signal transmission path including the photocoupler 6. A timing, at which the pulse signal exceeds the threshold value Vsh1 when the pulse signal is rising, is delayed, or a timing, at which the pulse signal becomes below a threshold value Vsh2 when the pulse signal is falling, is delayed. As shown in FIG. 5B, an error a is contained in the pulse signal transmitted to the microcomputer 28, where the pulse widths H1, H2 and H3 are changed by the error $\alpha$. When the pulse signal contains such an error a, the time ration Duty of the pulse signal calculated by the microcomputer 28 is shifted from the time ratio Duty determined in the map which corresponds to an actual temperature Tj of the power switching element SW. This has a possibility of decreasing a temperature detection accuracy of the power switching element SW. FIG. 5A and FIG. 5B show the case in which the pulse width of the pulse signal is extended by the error a (>0). There is another error a (<0) with which the pulse width of the pulse signal is shortened.

In order to avoid the deterioration of the temperature detection accuracy caused by the error $\alpha$, there is a method in which the error a is stored in advance in a memory section in the microcomputer 28, and the temperature information of the power switching element SW to be transmitted to the microcomputer 28 is corrected with the error a stored in the memory section, for example. However, the magnitude of such an error a is changed by an individual difference of the system, the use condition (such as a temperature condition), and an aged deterioration of the system. It is therefore difficult to avoid decreasing the temperature detection accuracy of the power switching element SW by the above error correction method.

Figure 6:
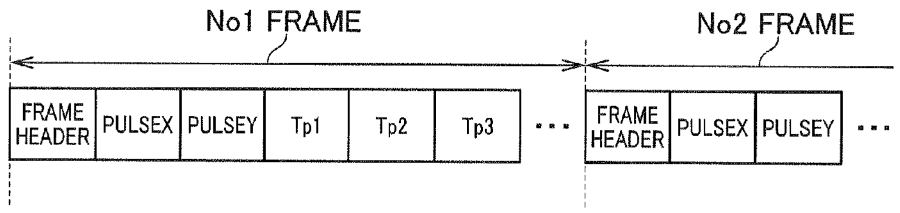
FIG. 6 is a view showing a structure of a frame used by the error correction device according to the first exemplary embodiment, in which corrected pulse signal values are stored.

FIG. 6 is a view showing a structure of a frame used by the error correction device according to the first exemplary embodiment, in which corrected pulse signal values are stored.

In order to avoid such a problem, as shown in FIG. 6, the frame generation section 20 (as a setting section) in the error correction device according to the first exemplary embodiment adds a pair of correction pulses sequentially into each frame. The pair of the correction pulses is composed of a first correction pulse signal PulseX and a second correction pulse signal PulseY. The first correction pulse signal PulseX and the second correction pulse signal PulseY sequentially arranged are stored in continuous sections in the frame, and the continuous sections storing the first correction pulse signal PulseX and the second correction pulse signal PulseY are added to a header section of the frame. Further, as shown in FIG. 6, temperature information Tp1, Tp2 and Tp3 (as pulse signals) are added to the section in the frame after the section in which the second correction pulse signal PulseY is stored.

A description will now be given of the error correction process for calculating an error a on the basis of the first correction pulse signal PulseX and the second correction pulse signal PulseY, and correcting temperature information of the power switching element on the basis of the calculated error a with reference to FIG. 7 and FIG. 8.

Figure 7:
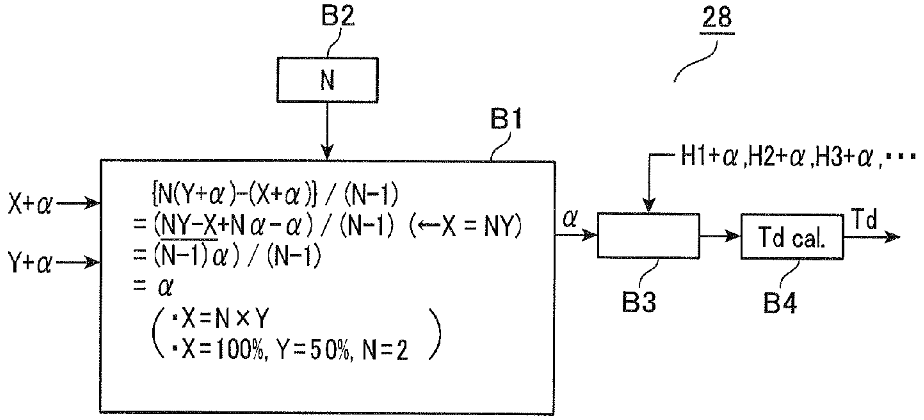
FIG. 7 is a view showing functional blocks used for an error correction process and a temperature detection process processed by the microcomputer in the error correction device according to the first exemplary embodiment.

FIG. 7 is a view showing functional blocks used for the error correction process and the temperature detection process processed by the microcomputer 28 in the error correction device according to the first exemplary embodiment. FIG. 8 is a view showing pulse signals transmitted to the microcomputer 28 through the pulse signal transmission path in the error correction device according to the first exemplary embodiment.

The microcomputer 28 receives the first correction pulse signal PulseX and the second correction pulse signal PulseY. The error calculation section B1 shown in FIG. 7 receives a pulse width of the first correction pulse signal PulseX and a pulse width of the second correction pulse signal PulseY, and calculates a value of an error a on the basis of the pulse width of the first correction pulse signal PulseX and the pulse width of the second correction pulse signal PulseY.

When the pulse width of the first correction pulse signal PulseX is designated by a reference character "X" and a pulse width of the second correction pulse signal PulseY is designated by a reference character "Y", the pulse width of the first correction pulse signal PulseX received by the error calculation section B1 becomes a value of "X+α", and the pulse width of the second correction pulse signal PulseY received by the error calculation section B1 becomes a value of "Y+α".

Figure 8:
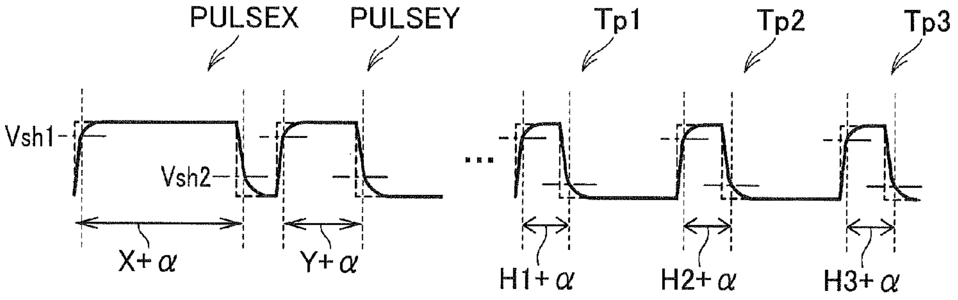
FIG. 8 is a view showing pulse signals transmitted to the microcomputer through the pulse signal transmission path in the error correction device according to the first exemplary embodiment.

As shown in FIG. 8, this means that each of the first correction pulse signal PulseX and the second correction pulse signal PulseY contains the same error α, like the temperature information Tp1, Tp2 and Tp3 of the power switching element SW. The error a has a constant value regardless of a value of the time ratio Duty (%).

A description will now be given of the process of calculating an error a by the error calculation section B1 with reference to FIG. 7.

When a variable N is an integer of not less than two (N≥2), an error α is calculated by using the following equation (eq1). The variable N is stored in advance into a memory section B2 in the microcomputer 28.

$$\{N(Y+\alpha)-(X+a)\}/(N-1) \quad \text{(eq1).}$$

The error correction device according to the first exemplary embodiment uses a fixed value as the pulse width of the first correction pulse signal PulseX and a fixed value as the pulse width of the second correction pulse signal PulseY when the PWM comparator 16 outputs the first correction pulse signal PulseX and the second correction pulse signal PulseY so that following conditions (A) and (B) are satisfied.

Condition (A)

The pulse width of the first correction pulse signal PulseX is set to a value which is N times of the pulse width of the second correction pulse signal PulseY. In other words, the pulse width of the second correction pulse signal PulseY is set to a value which is 1/N times of the pulse width of the first correction pulse signal PulseX.

Using the condition (A) can suppress the calculation accuracy of the error a from being decreased. That is, when a division result of the pulse width of the first correction pulse signal PulseX with the pulse width of the second correction pulse signal PulseY becomes a decimal, there is a possibility of decreasing a calculation accuracy of the error a caused by a calculation error such as a round down to the nearest decimal when a point calculation is carried out. The condition (A) prevents decreasing the calculation accuracy. FIG. 7 shows that the calculation result by using the equation (eq1) becomes the error a on the basis of using the condition (A) [X=N×Y].

Condition (B)

The pulse width Y of the second correction pulse signal PulseY is set so that the variable N is set to a minimum value when the pulse width X of the first correction pulse signal PulseX is set at the timing when the PWM comparator 16 provides an output signal.

The condition (B) makes it possible to suppress the calculation accuracy of the error a from being decreased. That is, because the microcomputer 28 usually has a fixed sampling period, the calculation accuracy of the pulse width "Y+a" of the second correction pulse signal PulseY transmitted to the microcomputer 28 is more decreased according to decreasing the pulse width "Y" of the second correction pulse signal PulseY. There is thereby a possibility of decreasing the calculation accuracy of the error a. In order to avoid decreasing the calculation accuracy, the pulse width of the first correction pulse signal PulseX and the pulse width of the second correction pulse signal PulseY are set so that the condition (B) is satisfied. This makes it possible to suppress the calculation accuracy of the error a from being decreased.

In order to more suppress the calculation accuracy of the error a from being decreased, the error correction device according to the first exemplary embodiment sets the pulse width of the first correction pulse signal PulseX to the pulse width when the time ratio of the first correction pulse signal PulseX has a value of 100% at the timing when the PWM comparator 16 outputs the first correction pulse signal PulseX. Further, the pulse width of the second correction pulse signal PulseY is set to the value so that the variable N is 2 in order to satisfy the condition (B). That is, the error correction device according to the first exemplary embodiment sets the pulse width of the second correction pulse signal PulseY to the pulse width when the time ratio of the second correction pulse signal PulseY has a value of 50% at the timing when the PWM comparator 16 outputs the second correction pulse signal PulseY.

A correction section B3 eliminates a value of the error a from the temperature information (designated by the values "H1+a", "H2+a", and "H3+a" shown in FIG. 8) of the power switching element SW transmitted to the microcomputer 28. Specifically, the microcomputer 28 corrects the temperature information of the power switching element SW by subtracting the error a from the pulse width of the pulse signal such as the pulse width of the first correction pulse signal PulseX and the pulse width of the second correction pulse signal PulseY as the temperature information of the power switching element SW.

A correction section B4 calculates the time ratio Duty of the pulse signal as the temperature information on the basis of the corrected temperature information of the power switching element SW. The correction section B4 executes the temperature detection process of calculating the temperature detection value Td of the power switching element SW on the basis of the calculated time ratio Duty.

Figure 9:
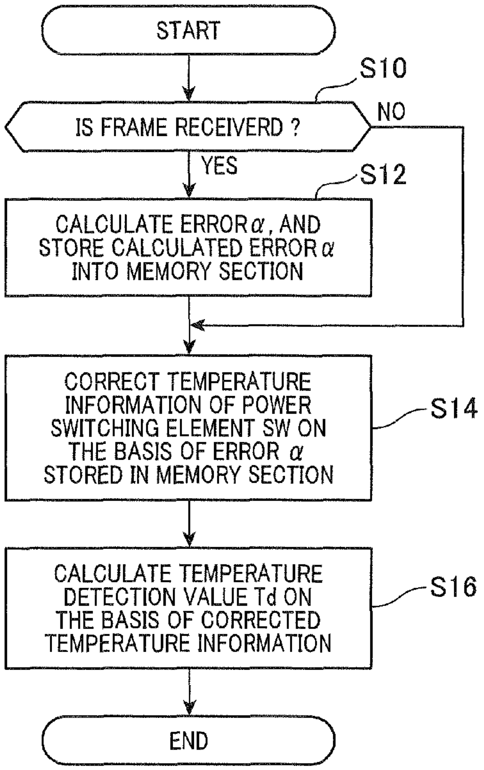
FIG. 9 is a view showing a flow chart of executing an error correction process and the temperature detection process processed by the error correction device according to the first exemplary embodiment.

FIG. 9 is a view showing a flow chart of executing the error correction process and the temperature detection process processed by the microcomputer 28 as the error correction device according to the first exemplary embodiment.

The microcomputer 28 as the error correction device repeatedly executes the error correction process and the temperature detection process at predetermined intervals.

In step S10, the microcomputer 28 detects whether or not a frame has been received. This detection process in step S10 detects whether or not the first correction pulse signal PulseX and the second correction pulse signal PulseY are received. The first correction pulse signal PulseX and the second correction pulse signal PulseY are used for calculating an error a.

When the detection result in step S10 indicates affirmation ("YES" in step S10), namely indicates that the microcomputer 28 receives the first correction pulse signal PulseX and the second correction pulse signal PulseY. The operation flow goes to Step S12.

In step S12, the microcomputer 28, namely, the error calculation section B1 calculates an error a on the basis of the received first correction pulse signal PulseX and the second correction pulse signal PulseY. The error calculation section B1 stores the calculated error a into a register as a memory section. This operation updates the content stored in the register as the memory section in the microcomputer 28. Thus, the microcomputer 28 is equipped with the register.

The operation flow goes to Step S14. In step S14, the correction section B3 corrects the temperature information of the power switching element SW on the basis of the newest error a stored in the register.

On the other hand, when the detection result in step S10 indicates negation ("NO" in step S10), namely indicates that the microcomputer 28 does not receive the first correction pulse signal PulseX and the second correction pulse signal PulseY. The operation flow goes to step S14 without executing the step S12. In this case, the correction section B3 corrects the temperature information of the power switching element SW on the basis of the error a previously detected and stored in the register.

The operation flow goes to Step S16. In step S16, the correction section B4 executes the temperature detection process of calculating the temperature detection value Td of the power switching element SW on the basis of the calculated temperature information on the basis of the calculated time ratio Duty.

When the process in step S16 shown in FIG. 9 has been completed, the microcomputer 28 temporarily stops the execution of the error correction process and the temperature detection process shown in FIG. 9.

The error correction device and the method of executing the error correction process and the temperature detection process according to the first exemplary embodiment have the following effects (1), (2) and (3).

(1) The error correction device according to the first exemplary embodiment sets the pulse width X of the first correction pulse signal PulseX and the pulse width Y of the second correction pulse signal PulseY to the values so as to satisfy the condition (A), as previously described. This makes it possible to avoid the calculation accuracy of the error a from being decreased, where the decreasing of the calculation error is by the calculation error caused when a division result of the pulse width of the first correction pulse signal PulseX with the pulse width of the second correction pulse signal PulseY becomes a decimal. Further, this makes it possible to avoid the temperature detection accuracy of the power switching element SW from being decreased. Still further, it is possible for the microcomputer 28 to execute a software program and to easily calculate the error a.

(2) The error correction device according to the first exemplary embodiment sets the pulse width X of the first correction pulse signal PulseX and the pulse width Y of the second correction pulse signal PulseY to the values so as to satisfy the condition (B), as previously described. In particular, the error correction device according to the first exemplary embodiment sets the pulse width of the first correction pulse signal PulseX to the pulse width when the time ratio of the first correction pulse signal PulseX has a value of 100% at the timing when the PWM comparator 16 outputs the first correction pulse signal PulseX. This makes it possible to suppress the calculation accuracy of the error a from being decreased with more efficiency.

(3) The error correction device according to the first exemplary embodiment sets the data items of the first correction pulse signal PulseX and the second correction pulse signal PulseY sequentially following the header section in the frame. That is, the data items of the first correction pulse signal PulseX and the second correction pulse signal PulseY are sequentially written before the data items regarding the temperature information of the power switching element SW in the frame. The error correction device according to the first exemplary embodiment executes the error correction process and the temperature detection process every time when receiving the frame having the frame structure previously described. This makes it possible to avoid the receiving period of the temperature information of the power switching element SW from being lengthened, and to avoid the influence of noise from decreasing the detection accuracy of a temperature of the power switching element SW. That is, it is possible to increase the noise resistance. Furthermore, this makes it possible for the microcomputer 28 to execute a software program and to easily detect the first correction pulse signal PulseX and the second correction pulse signal PulseY.

Second Exemplary Embodiment

A description will be given of the error correction device according to a second exemplary embodiment with reference to FIG. 10 and FIG. 11.

Figure 10:
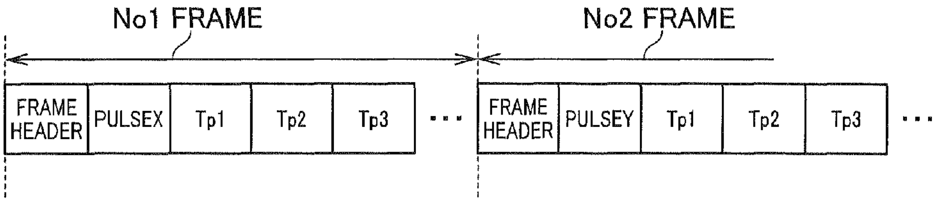
FIG. 10 is a view showing a structure of a frame used by the error correction device according to a second exemplary embodiment of the present invention, in which corrected pulse signal values are stored.

FIG. 10 is a view showing a structure of a frame used by the error correction device according to the second exemplary embodiment, in which corrected pulse signal values are stored. The difference between the second exemplary embodiment and the first exemplary embodiment will be explained for brevity.

The error correction device according to the second exemplary embodiment executes a process of setting the first correction pulse signal PulseX and the second correction pulse signal PulseY to the frame, which is different from the process processed by the error correction device according to the first exemplary embodiment. As shown in FIG. 10, data items of the first correction pulse signal PulseX and the second correction pulse signal PulseY are set into sections in adjacent frames which are adjacent in time to each other. That is, the pulse width of the first correction pulse signal PulseX and the pulse width of the second correction pulse signal PulseY are alternately set into the frames which are sequentially outputted.

Figure 11:
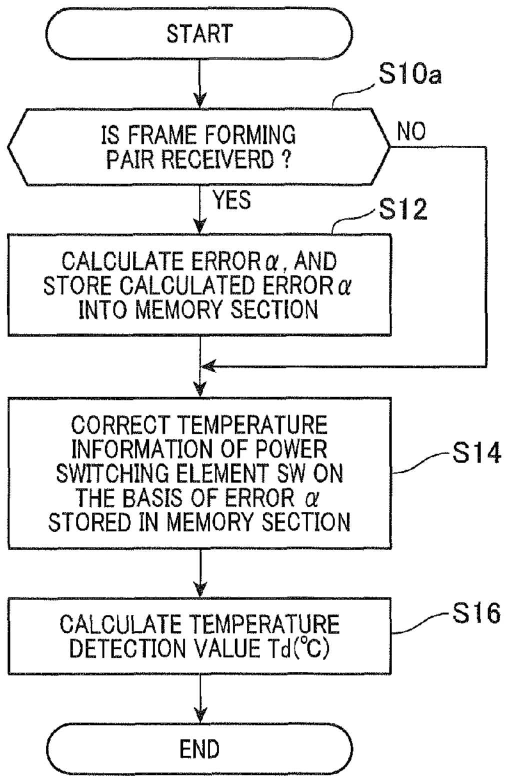
FIG. 11 is a view showing a flow chart of executing an error correction process and a temperature detection process processed by the error correction device according to the second exemplary embodiment.

FIG. 11 is a view showing a flow chart of executing the error correction process and the temperature detection process processed by the error correction device according to the second exemplary embodiment. As shown in FIG. 11, the microcomputer 28 as the error correction device according to the second exemplary embodiment executes the error correction process shown in FIG. 11. The same steps between the second exemplary embodiment shown in FIG. 11 and the first exemplary embodiment shown in FIG. 9 will be referred with the same step numbers.

In step S10*a*, the microcomputer 28 detects whether or not received frames have a pair of the frames sequentially adjacent to each other. The step S10*a* corresponds to step S10 shown in FIG. 9.

When the detection result in step S10*a* indicates affirmation ("YES" in step S10*a*), the operation flow goes to step S12. In step S12, like the first exemplary embodiment, the microcomputer 28, namely, the error calculation section B1 calculates an error a on the basis of the received first correction pulse signal PulseX and the second correction pulse signal PulseY. The error calculation section B1 stores the calculated error a into a register as a memory section. This operation updates the content stored in the register as the memory section in the microcomputer 28.

On the other hand, when the detection result in step S10*a* indicates negation ("NO" in step S10*a*), the operation flow goes to step S14. In step S14, like the first exemplary embodiment, the correction section B3 corrects the temperature information of the power switching element SW on the basis of the newest error a stored in the register.

Like the first exemplary embodiment, the operation flow goes to Step S16. In step S16, the correction section B4 executes the temperature detection process of calculating the temperature detection value Td of the power switching element SW on the basis of the calculated temperature information on the basis of the calculated time ratio Duty.

When the process in step S16 shown in FIG. 11 has been completed, the microcomputer 28 temporarily stops the execution of the error correction process and the temperature detection process shown in FIG. 9.

The error correction device and the method of executing the error correction process and the temperature detection process according to the second exemplary embodiment have the following effect (4) in addition to the effects (1), (2) and (3) as previously described.

(4) The process according to the second exemplary embodiment makes it possible to avoid the content as the temperature information of the power switching element SW, which can be set into the frames, from being reduced or decreased.

Third Exemplary Embodiment

A description will be given of the error correction device according to a third exemplary embodiment with reference to FIG. 12 and FIG. 13.

Figure 12:
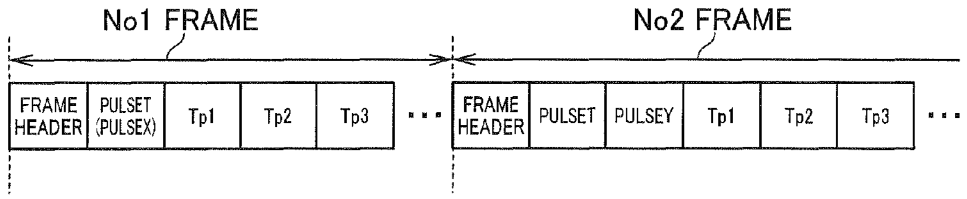
FIG. 12 is a view showing a structure of a frame used by the error correction device according to a third exemplary embodiment of the present invention, in which corrected pulse signal values are stored.

FIG. 12 is a view showing a structure of a frame used by the error correction device according to the third exemplary embodiment, in which corrected pulse signal values are stored. The difference between the third exemplary embodiment and the second exemplary embodiment will be explained for brevity.

The microcomputer 28 as the error correction device according to the third exemplary embodiment executes a calculation process of calculating the time ratio of the pulse signal to a frame length and a setting process of setting the calculated time ratio of the pulse signal to a frame, which are different from the calculation process of calculating the time ratio of the pulse signal, and the setting process of setting or arranging data items including the calculated time ratio of the pulse signal into a frame processed by the microcomputer 28 as the error correction device according to the second exemplary embodiment.

A description will now be given of the calculation process of calculating the time ratio of the pulse signal to a frame length processed by the microcomputer 28 as the error correction device according to the third exemplary embodiment.

As shown in FIG. 12, the microcomputer 28 according to the third exemplary embodiment sets a reference pulse signal PulseT into a section which follows the header section in each frame. The microcomputer 28 uses the reference pulse signal PulseT to correct the pulse signals Tp1, Tp2, and Tp3 as the temperature information of the power switching element SW. The reference pulse signal PulseT has a time ratio of 100%.

The microcomputer 28 divides the pulse width of the pulse signal as the temperature information of the power switching element SW with the pulse width Z of the reference pulse signal PulseT (as a reference pulse width) in order to calculate the time ratio Duty of the pulse signal. The calculation process for calculating the timer ratio Duty makes it possible to avoid the detection accuracy of the temperature of the power switching element SW from being decreased.

That is, there is a possibility that an individual difference of the carrier generation circuit 18 generated by a manufacturing process shifts a frequency of a triangle wave signal tc outputted from the carrier generation circuit 18 from a previously predicted frequency. In this case, there is a possibility that the pulse width of the pulse signal as the temperature information of the power switching element SW is also shifted from a previously predicted value. Further, there is a possibility of decreasing the detection accuracy of the temperature information of the power switching element SW because the time duty Duty calculated by the microcomputer 28 is shifted from the time duty Duty stored in the map which corresponds to an actual temperature Tj of the power switching element SW. In this case, the reference time Tperiod, which is used as a denominator when the time ratio Duty of the pulse signal is calculated, is stored as a fixed value into the memory section in the microcomputer 28.

When the frequency of the triangle wave signal tc is shifted from a previously predicted frequency, the pulse width of the pulse signal as the temperature information of the power switching element SW is changed and the pulse width of the reference pulse signal PulseT is also changed. In this case, the pulse signal as the temperature information of the power switching element SW and the reference pulse signal PulseT have their ratios changed by this same value.

Figures 13A, 13B:
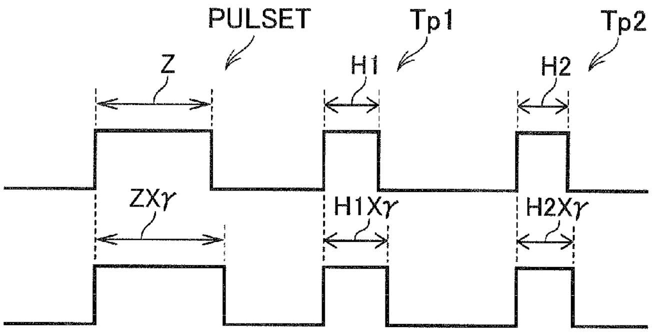
FIG. 13A and FIG. 13B are views showing cases in which errors are added into a pulse signal caused by frequency shift of a triangle wave used in an error correction device according to the third exemplary embodiment.

FIG. 13A and FIG. 13B are views showing cases in which errors are added into a pulse signal caused by shifting a frequency of a triangle wave used in the error correction device according to the third exemplary embodiment.

As shown in FIG. 13A and FIG. 13B, the pulse width of the reference pulse signal PulseT, and the pulse widths of the temperature information Tp1 and Tps designated by Z, H1 and h2 are changed to the pulse widths Zxy, H1Xy and H2Xy, respectively. The pulse widths Zxy, H1Xy and H2Xy, are obtained by multiplying the pulse widths Zx, H1X and H2X by a variable y, respectively. That is, FIG. 13A shows the previously predicted pulse signals Z, H1 and H2. FIG. 13B shows the transition of the pulse signal changed by a shift of the frequency of the triangle signal tc.

Accordingly, the calculated time ratio Duty is free from the influence caused by a frequency deviation or a frequency shift of a triangle wave signal tc, where the ratio Duty is calculated by dividing the pulse width of the pulse signal as the temperature information of the power switching element SW by the pulse width of the reference pulse signal PulseT. It is therefore possible for the error correction device according of the second exemplary embodiment to avoid the deterioration of the temperature detection accuracy of the power switching element SW from being decreased because of using the calculated time ratio Duty.

Next, a description will now be given of a method of arranging or setting data items into a frame by the error correction device according to the third exemplary embodiment.

As previously explained with reference to FIG. 12, the first correction pulse signal PulseX and the reference pulse signal PulseT are commonly used in the same section (PulseT=PulseX) in both frames of pairs of frames sequentially adjacent in time to each other. This makes it possible to avoid the accuracy of the temperature information of the power switching element SW, which can be stored and arranged in a frame, from being decreased.

Other Modifications

The concept of the present invention is not limited by the disclosures of the first, second and third exemplary embodiments previously described. For example, it is possible for the error correction device to have various modifications as follows.

The concept of the present invention is not limited by the method of arranging or setting the pulse width of the first correction pulse signal PulseX and the pulse width of the second correction pulse signal PulseY disclosed in the first exemplary embodiment and the second exemplary embodiment. For example, it is possible to use the following methods (C), (D) and (E).

(C) It is possible to set the pulse width Y of the second correction pulse signal PulseY so that a divided value becomes one of 4, 5 and 10, where each of the divided values 4, 5 and 10 is obtained by dividing the pulse width X of the first correction pulse signal PulseX with the pulse width Y of the second correction pulse signal PulseY. That is, it is possible to use the second correction pulse signal PulseY having a time ratio of 25%, 20%, or 10%. This case makes it also possible to calculate a value of the error a.

(D) It is possible for the first correction pulse signal PulseX to have a pulse width X which corresponds to a pulse width when the time ratio of the first correction pulse signal PulseX is less than 100%. In this case, for example, the pulse width X of the first correction pulse signal PulseX is set to a pulse width which corresponds to a pulse width when the first correction pulse signal PulseX has a time ratio of 90%, and the pulse width Y of the second correction pulse signal PulseY is set to a pulse width which corresponds to a pulse width when the second correction pulse signal PulseY has a time ratio of 30%.

(E) It is possible to set the pulse width X of the first correction pulse signal PulseX and the pulse width Y of the second correction pulse signal PulseY so that a division result of the pulse width X of the first correction pulse signal PulseX with the pulse width Y of the second correction pulse signal PulseY becomes a decimal. This case makes it also possible to calculate a value of the error a.

In this case, it is possible to calculate the error a by the following equation (eq2).

$$\{X(Y+a)-Y(X+a)\}/(X-Y) \quad \text{(eq2)}.$$

For example, it is sufficient to store into the memory section B2 in the microcomputer 28 the pulse width X of the first correction pulse signal PulseX and the pulse width Y of the second correction pulse signal PulseY at the timing when the PWM comparator 16 outputs the pulse width X of the first correction pulse signal PulseX and the pulse width Y of the second correction pulse signal PulseY.

Although the first exemplary embodiment shows the frame in which a pair of the correction pulse signals is stored, it is possible to store three or more correction pulse signals having a different pulse width into each frame. For example, when three correction pulse signals are sequentially arranged in each frame, because two pairs of the correction pulse signals are present in each frame, it is possible to calculate an error a in each pair, and to correct the temperature information of the power switching element SW on the basis of an average value of the calculated error values a. Even if noise is added into one of the three correction pulse signals, it is possible to suppress the influence of the noise on the calculation accuracy of the error a to be used for data correction. In this case, it is sufficient to use the time ratio of 100%, 50%, and 25% which corresponds to the three correction pulse signals, respectively.

The concept of the present invention is not limited by the method to set or arrange the first correction pulse signal PulseX and the second correction pulse signal PulseY into a frame disclosed by the second exemplary embodiment. For example, it is possible to set the first correction pulse signal PulseX and the second correction pulse signal PulseY into different frames, respectively, which are separated to each other.

In the third exemplary embodiment previously described, it is possible to use a pulse width which corresponds to a case when the time ratio of the pulse signal is less than 100%, instead of using the pulse width Z of the reference pulse signal PulseT. In this case, a map to be used for detecting a temperature of the powers switching element SW is switched to another map which corresponds to the reference pulse signal PulseT having the above pulse width.

It is possible for each of first exemplary embodiment and the second exemplary embodiment previously described to use the method of calculating the time duty Duty of the pulse signal used by the error correction device according to the third exemplary embodiment. In this modification, for example, it is sufficient to arrange the reference pulse signal PulseT between the frame header section and the section of the first correction pulse signal PulseX in the frame shown in FIG. 6. In addition, for example, it is sufficient to arrange the reference pulse signal PulseT between the frame header section and the section of the first correction pulse signal PulseX in the frame (No1), and the reference pulse signal PulseT between the frame header section and the section of the second correction pulse signal PulseY in the frame (No2), as shown in FIG. 10.

The concept of the present invention is not limited by the method of using the reference pulse signal PulseT which is commonly used as the correction pulse signal (for example, the first correction pulse signal PulseX) disclosed in the third exemplary embodiment. For example, when the first exemplary embodiment uses the method of the third exemplary embodiment, it is possible to commonly use the reference pulse signal T with one of the first correction pulse signal PulseX and the second correction pulse signal PulseY (PulseT=PulseX or PulseT=PulseY), where the first correction pulse signal PulseX and the second correction pulse signal PulseY are sequentially arranged in each frame.

The concept of the present invention is not limited by the method of commonly using the reference pulse signal PulseT with the first correction pulse signal PulseX in the first correction pulse signal PulseX or the second correction pulse signal PulseY. For example, it is possible to commonly use the reference pulse signal PulseT with the second correction pulse signal PulseY in a frame which is sequentially arranged in time with the frame in which the first correction pulse signal PulseX is arranged. In this case, the pulse width of the reference pulse signal PulseT commonly used as the second correction pulse signal PulseY corresponds to the pulse width when the time ratio of the reference pulse signal PulseT is less than 100%. Accordingly, in this case, it is possible for the error correction device to use different maps, where one map is used in the temperature detection process of the power switching element SW on the basis of the temperature information arranged in the frame in which the first correction pulse signal PulseX is stored, and the other map is used in the temperature detection process of the power switching element SW on the basis of the temperature information arranged in the frame in which the second correction pulse signal PulseY is stored.

In the previous explanation, the microcomputer 28 executes software programs to execute the processes of the error calculation section, the correction section and the detection section. However, the concept of the present invention is not limited by this. For example, it is possible that the error correction device is equipped with hardware devices (see FIG. 1) which have the functions of the error calculation section, the correction section and the detection section.

In each of the first to third exemplary embodiments previously described, the temperature information of one power switching element SW is transmitted through a single photocoupler, namely, the power switching element SW and the photocoupler are arranged in a one-to-one correspondence. However, the present invention is not limited by this structure. For example, it is possible for a single photocoupler to transmit temperature information of one or more power switching elements SW. In this structure, the frame generation section 20 sets the temperature information of the plural power switching elements SW in each frame.

It is possible to use a magnet isolator (for example, a pulse transformer), etc. instead of such a photocoupler as the opto-isolator.

The present invention is not limited by the high voltage system as the first section, and the low voltage system as the second section disclosed in the first exemplary embodiment shown in FIG. 1. For example, it is possible to use the low voltage system as the first section and the high voltage system as the second section when data items regarding the temperature information of the power switching element SW must be transmitted from the low voltage system to the high voltage system.

The error correction device according to the first exemplary embodiment calculates an error a every time when the microcomputer 28 receives the frame transmitted through the photocoupler 26 as the opto-isolator, and corrects the pulse signal on the basis of the calculated error a. However, the present invention is not limited by this structure. For example, when the microcomputer 28 has a limited ability of calculating such an error a, it is possible for the error correction device to calculate an error every time after the microcomputer 28 receives a group of M frames (M is two or more integer).

It is possible for the modulation section to use sawtooth waves as carriers instead of triangle wave signals.

It is possible to use a frequency modulation circuit which receives the output signal Vf of the temperature sensing diode SD and outputs a pulse signal having a frequency which increases according to the temperature of the power switching element SW, instead of using the modulation section for modulating the pulse width of the output signal of the temperature sensing diode SD. In this structure, the pulse signal outputted from the frequency modulation circuit is transmitted to the microcomputer 28 as the detection section through the photocoupler as an opto-isolator. The microcomputer 28 detects the temperature of the power switching element SW so that the temperature of the power switching element SW is higher when the received pulse signal has a narrower pulse width. In this structure, the temperature detection accuracy of the temperature of the power switching element SW is decreased when the pulse signal includes an error a which changes the pulse width of the pulse signal. It is possible for the error detection device according to the present invention to increase the detection accuracy of the temperature of the power switching element SW.

The first to third exemplary embodiments use the temperature sensing diode as the detection element capable of detecting a temperature as a value of a physical property of the power switching element SW. However, the present invention is not limited by this structure. It is possible to use a temperature sensing resistance, for example. In this case, it is sufficient to connect one terminal of the temperature sensing resistance to the output side terminal of the constant current source 14, and to connect the other terminal of the temperature sensing resistance to the ground. In this structure, the temperature sensing resistance is used as the detection element for detecting a temperature of the power switching element SW and outputting a signal which correlates with the detected temperature of the temperature sensing resistance. In this case, the more the temperature of the power switching element SW is increased, the more the voltage drop of the temperature sensing resistance is increased.

Further, it is possible to use a metal oxide semiconductor field effect transistor (MOS FET), for example. When the same current flows between the source and the drain of the MOS FET, a voltage between the source and the drain of the MOS FET depends on a temperature of the power switching element SW.

The error correction device according to the first, second and third exemplary embodiments as previously described detects a signal outputted from the power switching element SW as the detection target, where the outputted signal correlates with a temperature of the power switching element SW. However, the present invention is not limited by this structure. For example, it is possible to use another element as a detection target so long as the element outputs a signal which correlates with a value of a physical property of the element such as the power switching element SW.

While specific embodiments of the present invention have been described in detail, it will be appreciated by those skilled in the art that various modifications and alternatives to those details could be developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. An error correction device to be used in a physical property value detection device capable of detecting a value of a physical property of a detection target, comprising:

a modulation section configured to receive output signals transmitted from a detection element, the detection element detecting a value of a physical property of a detection target, generating and outputting the output signals, which correlate with the detected value of the physical property of the detection target, the modulation section further configured to modulate the received output signals to pulse signals, and output the modulated pulse signals;

a setting section for setting a plurality of correction pulse signals having a different pulse width into a series of the modulated pulse signals outputted from the modulation section;

a transmission path through which the modulated pulse signals and the correction pulse signals outputted from the setting section are transmitted;

an error calculation section for calculating an error contained in the modulated pulse signals transmitted through the transmission path on the basis of a pair of correction pulse signals in the modulated pulse signals transmitted through the transmission path, where a pulse width of the modulated pulse signal is changed by the error;

a correction section for correcting the modulated pulse signals to be used for detecting the value of the physical property of the detection element on the basis of the error calculated by the error calculation section; and a detection section configured to detect the value of the physical property of the detection element on the basis of the modulated pulse signals corrected by the correction section.

2. The error correction device to be used in a physical property value detection device according to claim 1, wherein the modulation section executes a pulse width modulation for the output signals of the detection element and outputs modulated pulse signals, the detection section receives the modulated pulse signals transmitted through the transmission path, and detects the value of the physical property of the detection target on the basis of a time ratio of successively received modulated pulse signals, where the time ratio is a ratio of a time length of a logical high level to a sum of a time length of a logical low level and a time length of the logical high level and the error calculation section calculates the error contained in the modulated pulse signals on the basis of a pulse width of the correction pulse signal at a timing when the setting section modulated each of the plurality of the correction pulse signals to produce the modulated pulse signals.

3. The error correction device to be used in a physical property value detection device according to claim 2, wherein a pair in the plurality of the correction pulse signals is comprised of a first correction pulse signal and a second correction pulse signal, and the pulse width of the first correction pulse signal at a timing when the setting section writes the first correction pulse signal to a frame is N times a pulse width of the second correction pulse signal at a timing when the setting section sets the second correction pulse signal into the frame.

4. The error correction device to be used in a physical property value detection device according to claim 3, wherein the pulse width of the second correction pulse signal at the timing when the setting section sets the second correction pulse signal into the frame is determined so that the value of the N times has a minimum value when the pulse width of the first correction pulse signal is set.

5. The error correction device to be used in a physical property value detection device according to claim 3, wherein a pulse width of one of the plurality of the correction pulse signals to be set by the setting section is a pulse width which corresponds to a case when the time ratio of the correction pulse signal is 100%.

6. The error correction device to be used in a physical property value detection device according to claim 1, further comprises an output section for generating and outputting a group of data containing the plurality of the modulated pulse signals outputted from the modulation section, and the setting section sequentially stores the plurality of the correction pulse signals into the series of the data outputted from the output section.

7. The error correction device to be used in a physical property value detection device according to claim 6, wherein the error calculation section calculates an error every time when receiving the series of the data to the error calculation section through the transmission path, and the correction section corrects the modulated pulse signal every time according to the error calculated by the error calculation section.

8. The error correction device to be used in a physical property value detection device according to claim 1, further comprising an output section for generating and outputting a group of data having the modulated pulse signals outputted from the modulation section, and the setting section divides the plurality of the correction pulse signals into the group of the data outputted from the output section, respectively.

9. The error correction device to be used in a physical property value detection device according to claim 8, wherein the error calculation section calculates an error every time when receiving the group of the data corresponding to the correction pulse signal which is a pair divided and arranged.

10. The error correction device to be used in a physical property value detection device according to claim 6, wherein the setting section sets the correction pulse signal into the series of the pulse signals in position before the modulated pulse signals outputted from the modulation section.

11. The error correction device to be used in a physical property value detection device according to claim 1, wherein the modulation section executes a pulse width modulation of the output signal on the basis of a magnitude of a carrier and the output signal of the detection element, and the error correction device comprises a setting section for setting a reference pulse signal having a reference pulse width to a series of the pulse signals outputted from the modulation section, and the detection section detects a value of the physical property of the detection target on the basis of the reference pulse signal and the modulated pulse signals outputted through the transmission path, and the setting section sets the reference pulse signal as at least one of the plurality of the correction pulse signals into the modulated pulse signals.

12. The error correction device to be used in a physical property value detection device according to claim 1, wherein the detection element is a temperature sensing diode capable of outputting an output signal which is negatively correlated with a temperature of the detection target.

13. The error correction device to be used in a physical property value detection device according to claim 1, wherein the detection element, the detection target and the modulation section are arranged in a first section, and the error calculation section, the error correction section, and the detection section are arranged in a second section which is electrically insulated from the first section through the transmission path, and the transmission path has an insulation transmission section capable of transmitting the modulated pulse signals from the first section to the second section while the first section is electrically insulated from the second section.

14. The error correction device to be used in a physical property value detection device according to claim 1, wherein the function of the error calculation section, the correction section and the detection section is realized by software stored in the error correction device.

15. The error correction device to be used in a physical property value detection device according to claim 1, wherein the function of the error calculation section, the correction section and the detection section is realized by a hardware section in the error correction device.

* * * * *